(12) United States Patent
Hirano

(10) Patent No.: US 6,980,019 B2
(45) Date of Patent: Dec. 27, 2005

(54) OUTPUT BUFFER APPARATUS CAPABLE OF ADJUSTING OUTPUT IMPEDANCE IN SYNCHRONIZATION WITH DATA SIGNAL

(75) Inventor: Kazutoshi Hirano, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 126 days.

(21) Appl. No.: 10/606,331

(22) Filed: Jun. 26, 2003

(65) Prior Publication Data

US 2004/0080336 A1    Apr. 29, 2004

(30) Foreign Application Priority Data

Jun. 28, 2002    (JP) ............................. 2002-189423

(51) Int. Cl.[7] .......................................... H03K 19/003
(52) U.S. Cl. ............................ 326/30; 326/32; 326/34; 326/87
(58) Field of Search ..................... 326/26, 27, 30–34, 326/87

(56) References Cited

U.S. PATENT DOCUMENTS

| | | |
|---|---|---|
| 5,134,311 A | 7/1992 | Biber et al. |
| 5,751,161 A | 5/1998 | Wei et al. |
| 6,094,069 A | 7/2000 | Magane et al. |
| 6,166,563 A | 12/2000 | Volk et al. |
| 6,292,014 B1 | 9/2001 | Hedberg |
| 2003/0146774 A1 * | 8/2003 | Coughlin et al. .............. 326/30 |

FOREIGN PATENT DOCUMENTS

JP    2002-94366    3/2002

OTHER PUBLICATIONS

Taiwanese Office Action dated Feb. 4, 2005, with English translation.
European Search Report dated Mar. 15, 2004.

* cited by examiner

*Primary Examiner*—Anh Q. Tran
(74) *Attorney, Agent, or Firm*—McGinn IP Law Group, PLLC

(57) ABSTRACT

In an output buffer apparatus including a main-buffer circuit including a plurality of first transistors each connected between a first power supply terminal and an output terminal and a plurality of second transistors each connected between a second power supply terminal and the output terminal, and a pre-buffer circuit including a plurality of first pre-drivers each driving one of the first transistors in accordance with a data signal and a plurality of second pre-drivers each driving one of the second transistors in accordance with the data signal, a plurality of first sequential circuits are provided for receiving first impedance adjusting signals in synchronization with the data signal to turn ON the first pre-drivers, and a plurality of second sequential circuits are provided for receiving second impedance adjusting signals in synchronization with the data signal to turn ON the second pre-drivers.

15 Claims, 16 Drawing Sheets

Fig. 3A PRIOR ART

| RUPi (RUPi') | D (D') | Pi (Pi') |
|---|---|---|
| "1" | "0" (low) | low (activating level) |
| | "1" (high) | high (deactivating level) |
| "0" | "0" (low) | high (deactivating level) |
| | "1" (high) | high (deactivating level) |

Fig. 3B PRIOR ART

| RDNi (RDNi') | D (D') | Ni (Ni') |
|---|---|---|
| "1" | "0" (low) | low (deactivating level) |
| | "1" (high) | high (activating level) |
| "0" | "0" (low) | low (deactivating level) |
| | "1" (high) | low (deactivating level) |

*Fig. 5* PRIOR ART

| Pi (Pi') | Ni (Ni') | OUT |
|---|---|---|
| low (activating level) | low (deactivating level) | high |
| low (activating level) | high (activating level) | forbidden |
| high (deactivating level) | low (deactivating level) | HZ |
| high (deactivating level) | high (activating level) | low |

| D | STATE |
|---|---|
| "0" (low) | HOLD |
| "1" (high) | THROUGH |

| D | STATE |
|---|---|
| "0" (low) | THROUGH |
| "1" (high) | HOLD |

OUTPUT BUFFER APPARATUS CAPABLE OF ADJUSTING OUTPUT IMPEDANCE IN SYNCHRONIZATION WITH DATA SIGNAL

BACKGROUND OF THE INVENTION

1. Field of the Invention

The present invention relates to an output buffer apparatus capable of adjusting the output impedance thereof.

2. Description of the Related Art

In a computer system, as the speed of a central processing unit (CPU) has increased, the propagation speed of signals between semiconductor devices and the propagation speed of signals between printed circuit boards have also increased. Note that microstrip lines or coaxial cables are used as transmission lines for transmitting high frequency signals.

When the frequency of transmitted signals is low, the wavelength of the transmitted signals is relatively large with respect to the length of the transmission line, so that the phases of the transmitted signals are approximately the same within the transmission line. Therefore, even when reflection noise is generated at a terminal of the transmission line due to a discrepancy between the output impedance of an output buffer apparatus and the characteristic impedance of the transmission line, since the phase of the reflection noise is the same as those of the transmitted signals, the transmitted signals are hardly distorted.

On the other hand, when the frequency of transmitted signals is high, the wavelength of the transmitted signals is relatively small with respect to the length of the transmission line, so that the phases of the transmitted signals are different from each other within the transmission line. Therefore, when reflection noise is generated at the terminal of the transmission line due to a discrepancy between the output impedance of the output buffer apparatus and the characteristic impedance of the transmission line, since the reflection noise may affect the transmitted signals, the transmitted signals are remarkably distorted.

In order to suppress the above-mentioned reflection noise, a terminal processing is carried out so that the characteristic impedance of the transmission line is brought close to an impedance at a signal transmitter side terminal, i.e., an output buffer of a first device or an impedance at a signal receiver side terminal, i.e., an input buffer of a second device which is connected via a transmission line to the first device.

Note that the terminal processing is divided into a parallel terminal processing where a resistance corresponding to the characteristic impedance is connected between the signal receiver terminal (the input buffer) and a power supply terminal (or the ground terminal) and a serial terminal processing where the output impedance of the signal transmitter side terminal (the output buffer) is brought close to the characteristic impedance of the transmission line.

In the above-mentioned serial terminal processing, a semiconductor chip including the output buffer is subject to environmental temperature, power supply voltage, manufacturing process and the like, so that the output impedance of the output buffer per se is subject to the environmental temperature, the power supply voltage, the manufacturing process and the like. Therefore, a prior art output buffer apparatus has been known to include an impedance adjusting circuit (see: JP-A-2002-94366). The output buffer apparatus is constructed by a main-buffer circuit including a plurality of P-channel MOS transistors each connected between a power supply terminal and an output terminal and a plurality of N-channel MOS transistors each connected between the ground terminal and the output terminal and a pre-buffer circuit including a plurality of first pre-drivers each driving one of the P-channel MOS transistors in accordance with a pull-up impedance adjusting signal and a data signal and a plurality of second pre-drivers each driving one of the N-channel MOS transistors in accordance with a pull-down impedance adjusting signal and the data signal. This will be explained later in detail.

In the above-described prior art output buffer apparatus, however, since the impedance adjusting signals are supplied to the pre-buffer circuit in asynchronization with the data signal, the output signal at the output terminal may be changed in the middle of data "1" or "0", i.e., the output signal at the output terminal is distorted, thus deteriorating the quality thereof.

SUMMARY OF THE INVENTION

It is an object of the present invention to provide an output buffer apparatus capable of suppressing the distortion of the output signal.

According to the present invention, in an output buffer apparatus including a main-buffer circuit including a plurality of first transistors each connected between a first power supply terminal and an output terminal and a plurality of second transistors each connected between an second power supply terminal and the output terminal, and a pre-buffer circuit including a plurality of first pre-drivers each driving one of the first transistors in accordance with a data signal and a plurality of second pre-drivers each driving one of the second transistors in accordance with the data signal, a plurality of first sequential circuits such as D-type flip-flops or latch circuits are provided for receiving first impedance adjusting signals in synchronization with the data signal to turn ON the first pre-drivers, and a plurality of second sequential circuits such as D-type flip-flops or latch circuits are provided for receiving second impedance adjusting signals in synchronization with the data signal to turn ON the second pre-drivers.

BRIEF DESCRIPTION OF THE DRAWINGS

The present invention will be more clearly understood from the description set forth below, as compared with the prior art, with reference to the accompanying drawings, wherein:

FIGS. 3A and 3B are tables for explaining the operation of the pre-buffer circuit (the dummy pre-buffer circuit) of FIG. 2;

FIG. 5 is a table for explaining the operation of the main-buffer circuit (the dummy main-buffer circuit) of FIG. 4;

DESCRIPTION OF THE PREFERRED EMBODIMENTS

Before the description of the preferred embodiments, a prior art output buffer apparatus will be explained with reference to FIGS. 1, 2, 3A, 3B, 4, 5, 6, 7A, 7B and 8.

Figure 1:
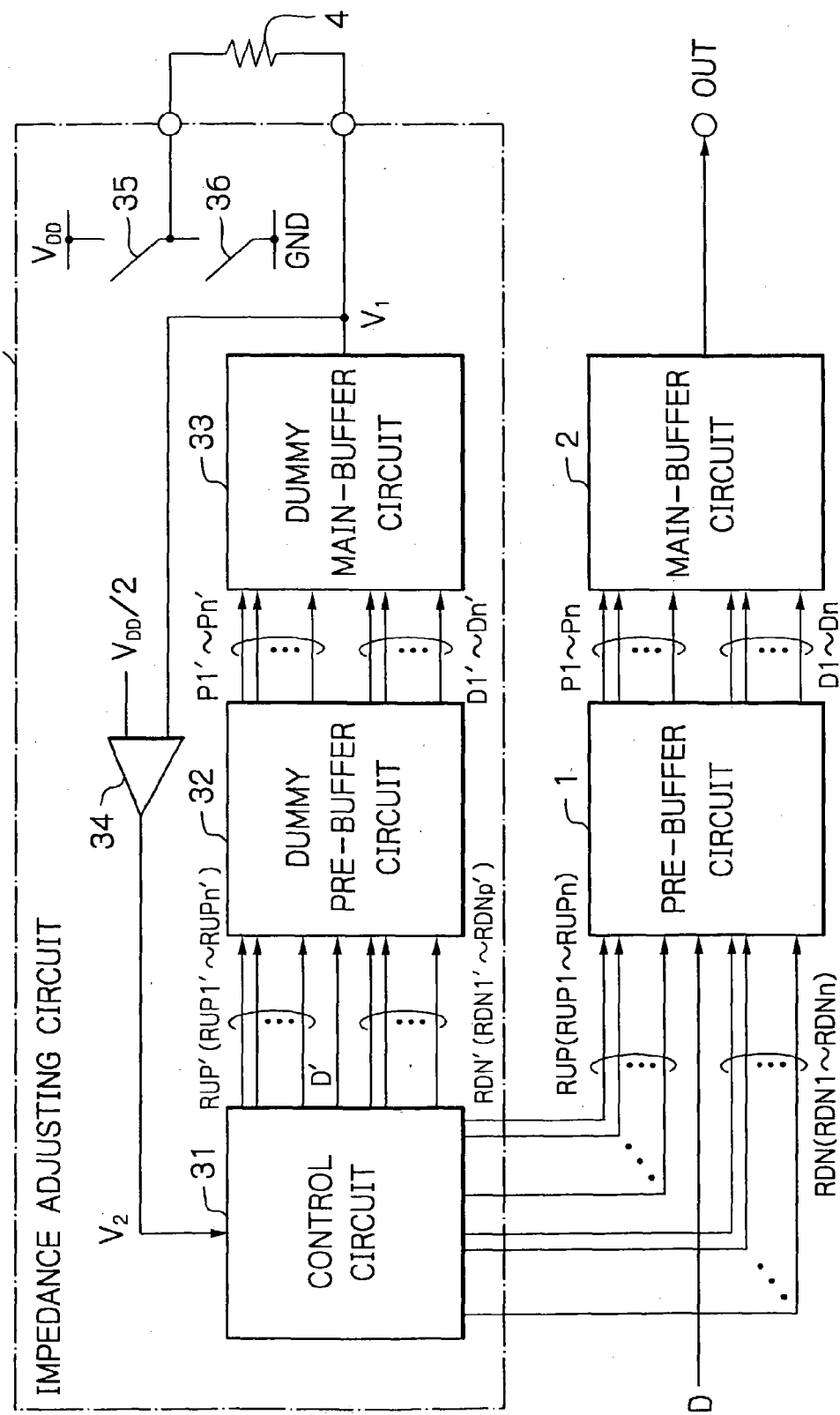
FIG. 1 is a block circuit diagram illustrating a prior art output buffer apparatus.

In FIG. 1, which illustrates a prior art output buffer apparatus (see: JP-A-2002-94366), a pre-buffer circuit 1 receives a data signal D from an internal circuit (not shown), pull-up impedance adjusting signals RUP1, RUP2, . . . , RUPn and pull-down impedance adjusting signals RDN1, RDN2, . . . , RDNn to generate pull-up signals P1, P2, . . . , Pn and pull-down signals D1, D2, . . . , Dn. The pull-up signals P1, P2, . . . , Pn and the pull-down signals D1, D2, . . . Dn are supplied to a main-buffer circuit 2 which, in turn, generates an output signal at the output terminal OUT.

The pull-up impedance adjusting signals RUP1, RUP2, . . . , RUPn and the pull-down impedance adjusting signals RDN1, RDN2, . . . , RDNn are generated from an impedance adjusting generating circuit 3 which is constructed by a control circuit circuit 31, a dummy pre-buffer circuit 32, a dummy main-buffer circuit 33, a comparator 34 and switches 35 and 36. In this case, the dummy pre-buffer circuit 32 and the dummy main-buffer circuit 33 have the same circuit configurations as the pre-buffer circuit 1 and the main-buffer circuit 2, respectively. In this case, the dummy pre buffer circuit 32 receives a dummy data signal D' and pull-up impedance adjusting signals RUP1', RUP2', . . . , RUPn', and pull-down impedance adjusting signals RDN1', RDN2', . . . , RDNn' from the control circuit 31. Also the, switches 35 and 36 formed by MOS transistors are controlled by the control circuit 31. Further, a resistor 4 is externally connected between the output of the dummy main-buffer circuit 33 and a node of the switches 35 and 36. Note that the resistor 4 can be internally provided in the output buffer apparatus of FIG. 1 In this case, the resistance value of the resistor 4 corresponds to the characteristic impedance of a transmission line to the connected to the output terminal OUT.

Figure 2:
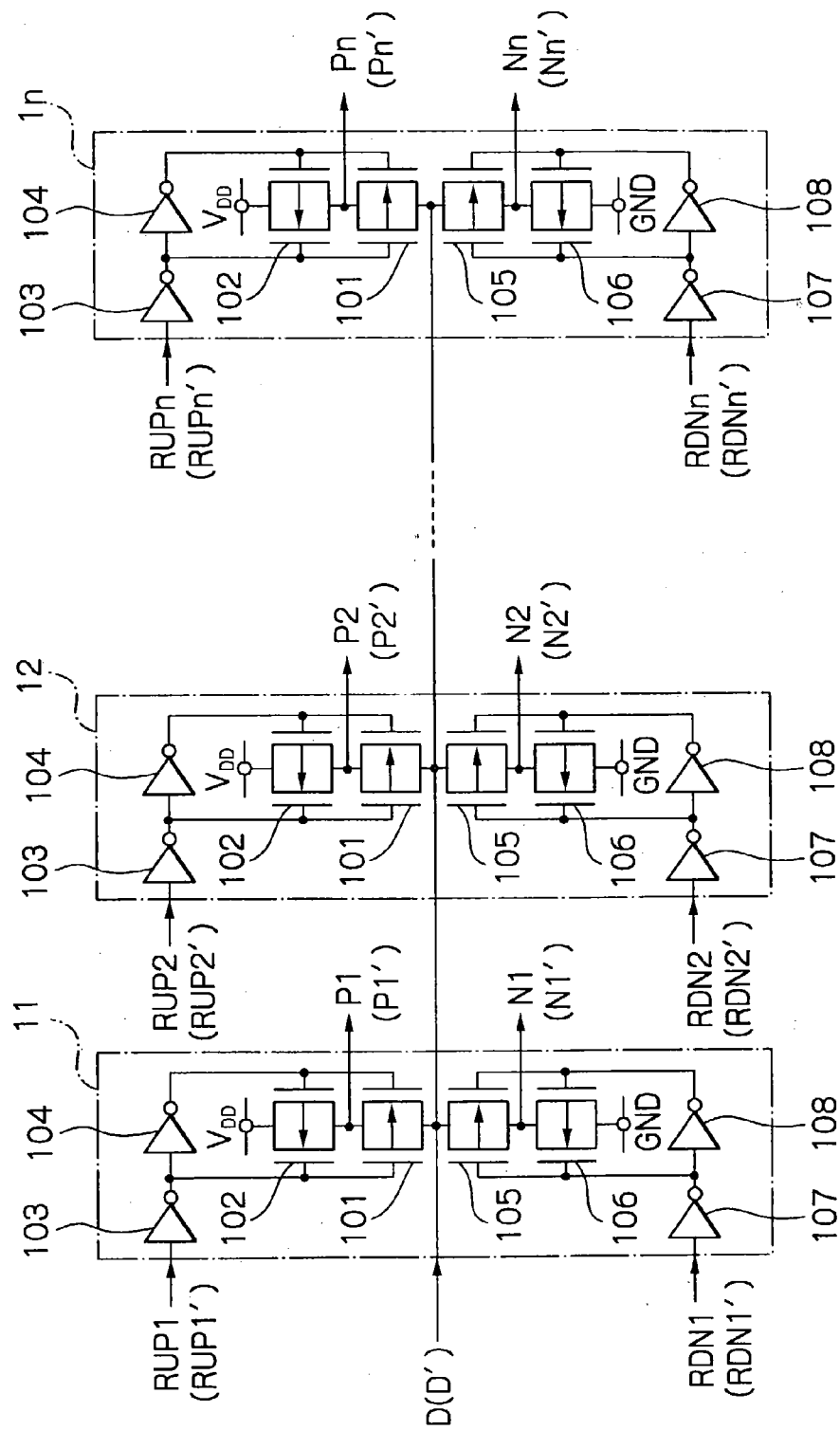
FIG. 2 is a detailed circuit diagram of the pre-buffer circuit (the dummy pre-buffer circuit) of FIG. 1.

As illustrated in FIG. 2, which is a detailed circuit diagram of the pre-buffer circuit 1 (the dummy pre-buffer circuit 32) of FIG. 1, the pre-buffer circuit 1 (the dummy pre-buffer circuit 32) is constructed by n-stage pre-drivers 11, 12, . . . , 1n each receiving the data signal D (the dummy data signal D'), one of the pull-up impedance adjusting signals RUP1, RUP2, . . . , RUPn (RUP1', RUP2', . . . , RUPn') and one of the pull-down impedance adjusting signals RDN1, RDN2, . . . , RDNn (RDN1', RDN2', . . . RDNn'). In more detail, the pre-driver 1$i$ (i=1, 2, . . . , n) is constructed by two transfer gates 101 and 102 connected in series powered by the data signal D (the dummy data signal D') and a high power supply voltage $V_{DD}$, and two inverters 103 and 104 for receiving the pull-up impedance adjusting signals RUPi (RUPi') to turn ON one of the transfer gates 101 and 102 and turn OFF the other. Also, the pre-driver 1$i$ (i=1, 2, . . . , n) is constructed by two transfer gates 105 and 106 connected in series powered by the data signal D (the dummy data signal D') and a ground voltage GNP, and two inverters 107 and 108 for receiving the pull-down impedance adjusting signals RDNi to turn ON one of the transfer gates 105 and 106 and turn OFF the other.

For example, as illustrated in FIG. 3A, when the pull-up impedance adjusting signal RUPI (RUpi') is "1" (high) and the data signal D (D') is "0" (low), the transfer gates 101 and 102 are turned ON and OFF, respectively, so that the pull-up signal Pi (Pi') is low (activating level). On the other hand, when the pull-up impedance adjusting signal RUPI (RUPi') is "1" (high) and the data signal D (D') is "1" (high), the transfer gates 101 and 102 are turned OFF and ON, respectively, so that the pull-up signal Pi (Pi') is high (deactivating level). Note that, if the data signal D (D') is high, the pull-up signal Pi (Pi') is high (deactivating level) regardless of the pull-up impedance adjusting signal RUPi (RUPi').

Similarly, as illustrating in FIG. 3B, when the pull-down impedance adjusting signal RDNi (RDNi') is "1" (high) and the data signal D (D') is (high), the transfer gates 105 and 106 are turned ON and OFF, respectively, so that the pull-down signal Ni (Ni') is high (activating level). On the other hand, when the pull-down impedance adjusting signal RUNi (RUNi') is "1" (high) and the data signal D (D') is low, the transfer gates 105 and 106 are turned OFF and ON, respectively, so that the pull-down signal Ni (Ni') is low (deactivating level). Note that, if the data signal D (D') is low, the pull-down signal Ni (Ni') is low (deactivating level) regardless of the pull-down impedance adjusting signal RDNi (RDNi').

As illustrated in FIGS. 3A and 3B, both of the pull-up signal Pi (Pi') and the pull-down signal Ni (Ni') are never at the activating levels simultaneously.

Figure 4:
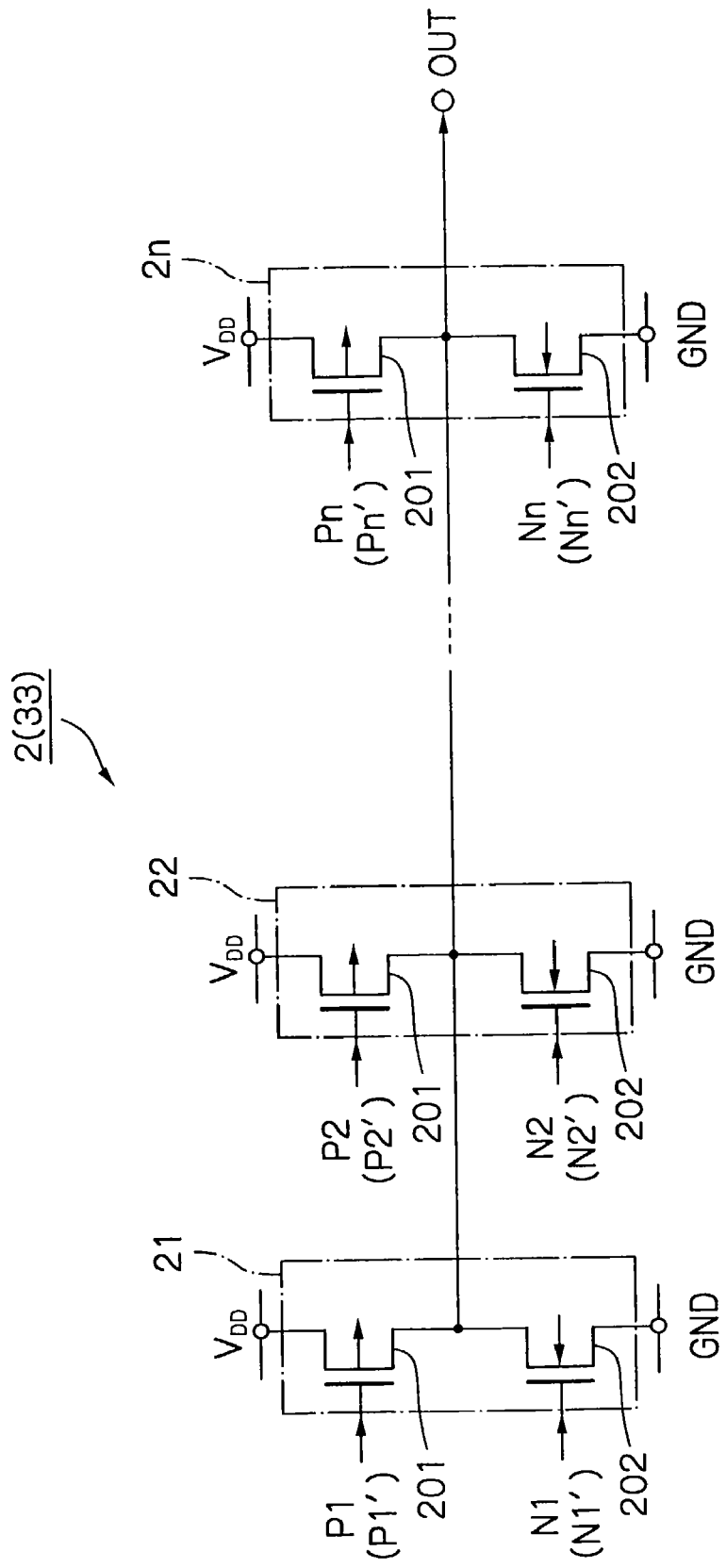
FIG. 4 is a detailed circuit diagram of the main-buffer circuit (the main-buffer circuit) of FIG. 1.

As illustrated in FIG. 4, which is a detailed circuit diagram of the main-buffer circuit 2 (the dummy main-buffer circuit 33) of FIG. 1, the main-buffer circuit 2(the dummy main-buffer circuit 33) is constructed by n-stage drivers 21, 22, . . . , 2n each receiving one of the pull-up signals P1, P2, . . . , Pn (P1', P2', . . . , Pn') and one of the pull-down signals N1', N2, . . . , Nn (N1', N2', . . . , Nn') from the pre-drivers 11, 12, . . . , 1n. In more detail, the driver 2$i$(i=1, 2, . . . , n) is constructed by a p-channel MOS transistor 201 and an N-channel MOS transistor 202 connected in series powered by the high power supply voltage $V_{DD}$ and the ground voltage GND.

For example, as illustrated in FIG. 5, when the pull-up signal Pi (Pi') is low (activating level) and the pull-down signal Ni is low (deactivating level), the transistors 201 and 202 are turned ON and OFF, respectively, so that the voltage at the output terminal OUT is high. On the other hand, when the pull-up signal Pi (Pi') is high (deactivating level) and the pull-down signal Ni is high (activating level), the transistors 201 and 202 are turned OFF and ON, respectively, so that the voltage at the output terminal OUT is low. Note that the pull-up signal Pi (Pi') and the pull-down signal Ni (Ni') are never at the activating levels simultaneously, i.e., which is forbidden. Also, when the pull-up signal Pi (Pi') is high (deactivating level) and the pull-down Ni (Ni') is low (deactivating level), the output terminal OUT is in a high impedance (HZ) state.

The number n of the stages of the pre-drivers 11, 12, ..., 1n, i.e., the drivers 21, 22, ..., 2n is predetermined to cover the range of the characteristic impedance of the transmission fluctuated by external conditions such as the environmental temperature and the external power supply voltages.

The calibrating operation of the impedance adjusting circuit 3 of FIG. 1 will be explained next with reference to FIGS. 6, 7A and 7B. Here, impedance codes RUP, RDN, RUP' and RDN' are defined by $$RUP=(RUPn, RUPn\text{-}1, \ldots, RUP1)$$

$$RDN=(RDNn, RDNn\text{-}1, \ldots, RDN1)$$

$$RUP'=(RUPn', RUPn\text{-}1', \ldots, RUP1')$$

$$RDN'=(RDNn', RDNn\text{-}1', \ldots, RDN1')$$

Figure 6:
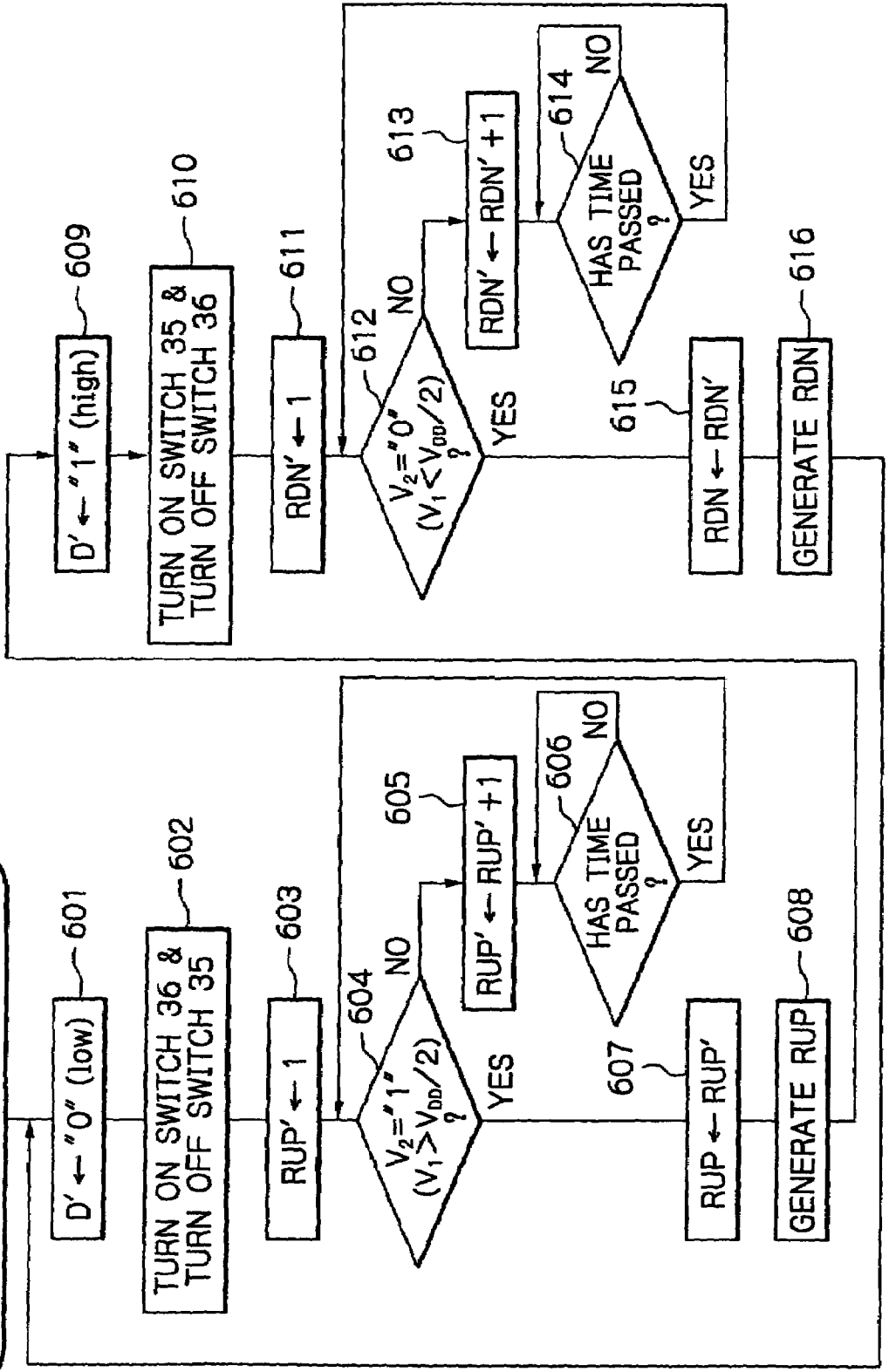
FIG. 6 is a flowchart for explaining the calibrating operation of the impedance adjusting circuit of FIG. 1.

The flowchart of FIG. 6 is carried out by the control circuit 31.

First, at step 601, the dummy data D' is made "0" (low). Then, at step 602, the switch 36 is turned ON while the switch 35 is turned OFF, thus carrying out a calibrating operation of the impedance code RUP. That is, at step 603, the impedance code RUP' is initialized at 1. Then, at step 604, it is determined whether or not $V_2$="1" where $V_2$ is the output signal of the comparator 34, i.e., whether or not the output voltage $V_1$ of the dummy main-buffer circuit 33 is higher than a predetermined value such as $V_{DD}/2$. The operation at step 604 is repeated by steps 605 and 606 until $V_2$="1" is satisfied. Note that step 606 waits a predetermined time. After $V_2$="1" is satisfied, the control proceeds to step 607 which renews the impedance code RUP with RUP' (RUP=RUP') as shown in FIG. 7A, and at step 607, the impedance code RUP is generated and transmitted to the pre-buffer circuit 1.

Next, at step 609, the dummy data D' is made "0" (low). Then, at step 610, the switch 35 is turned ON while the switch 36 is turned OFF, thus carrying out a calibrating operation of the impedance code RDN. That is, at step 611, the impedance code RDN' is initialized at 1. Then, at step 612, it is determined whether or not $V_2$="1", i.e., whether or not the output voltage $V_1$ of the dummy main-buffer circuit 33 is higher than a predetermined value such as $V_{DD}/2$. The operation at step 612 is repeated by steps 613 and 614 until $V_2$="1" is satisfied. Note that step 614 waits a predetermined time. After $V_2$="1" is satisfied, the control proceeds to step 615 which renews the impedance code RDN with RDN' (RDN=RDN') as shown in FIG. 7B, and at step 616, the impedance code RDN is generated and transmitted to the pre-buffer circuit 1.

Figure 7A:
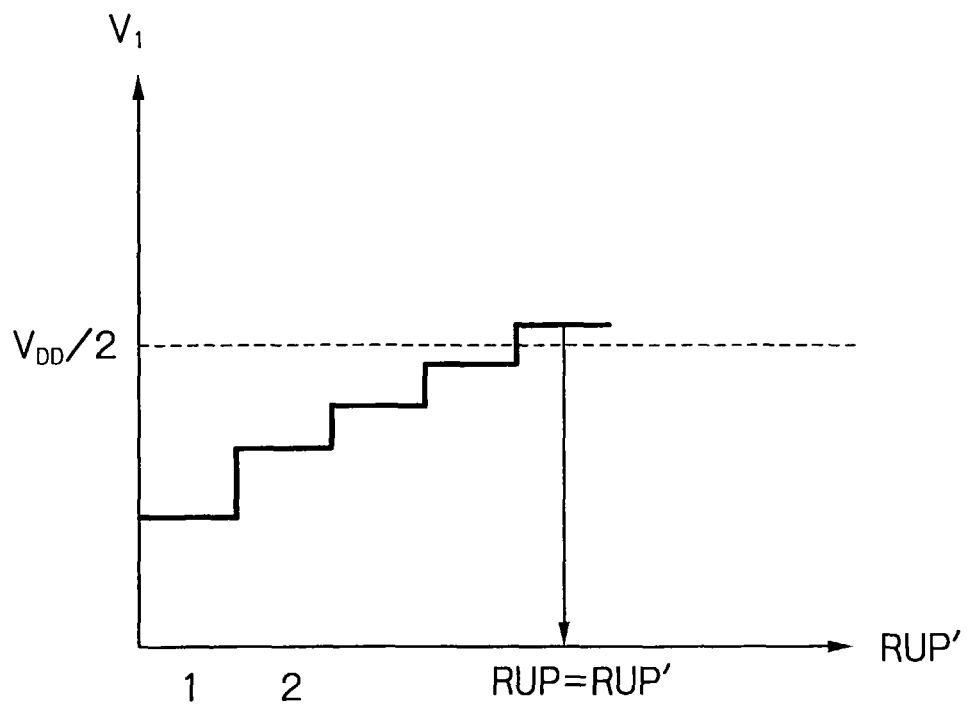
FIGS. 7A and 7B are graphs for showing the impedance codes calibrated by the flowchart of FIG. 6.
Figure 7B:
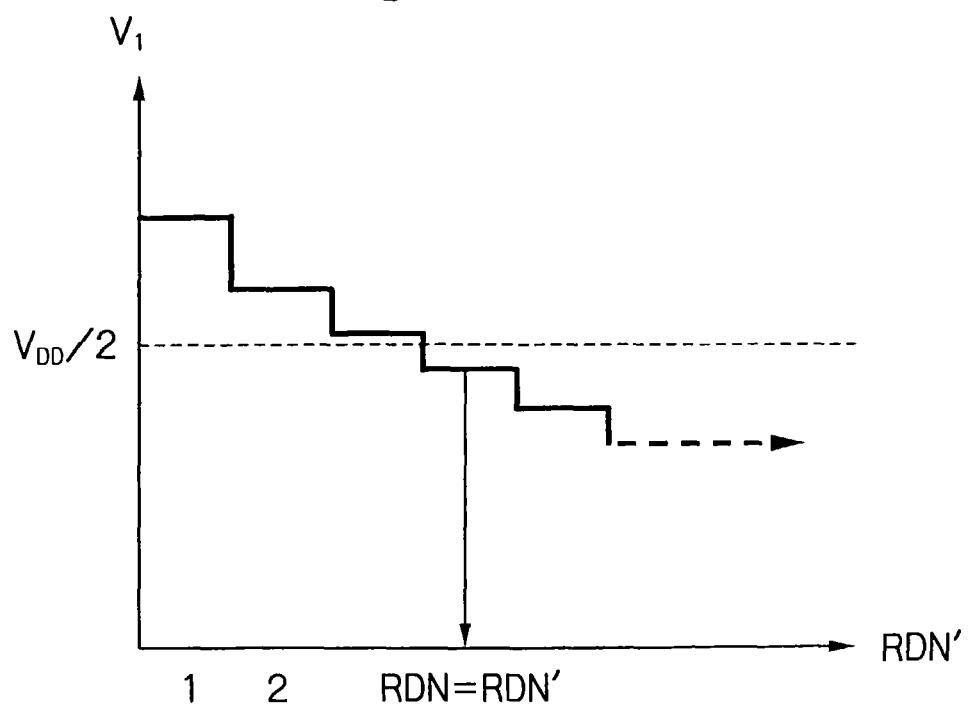

In the calibrating operation as illustrated in FIGS. 6, 7A and 7B, however, the calibrating operation is always carried out, i.e., the impedance codes RUP and RDN are renewed and fetched by the pre-buffer circuit 1 in synchronization with the data reading operation of the pre-buffer circuit 1 and the main-buffer circuit 2, so that the output signal at the output terminal OUT may be changed in the middle of data "1" or "0", i.e., the output signal at the output terminal OUT is distorted, thus deteriorating the quality of the output signal at the output terminal OUT.

Figure 8:
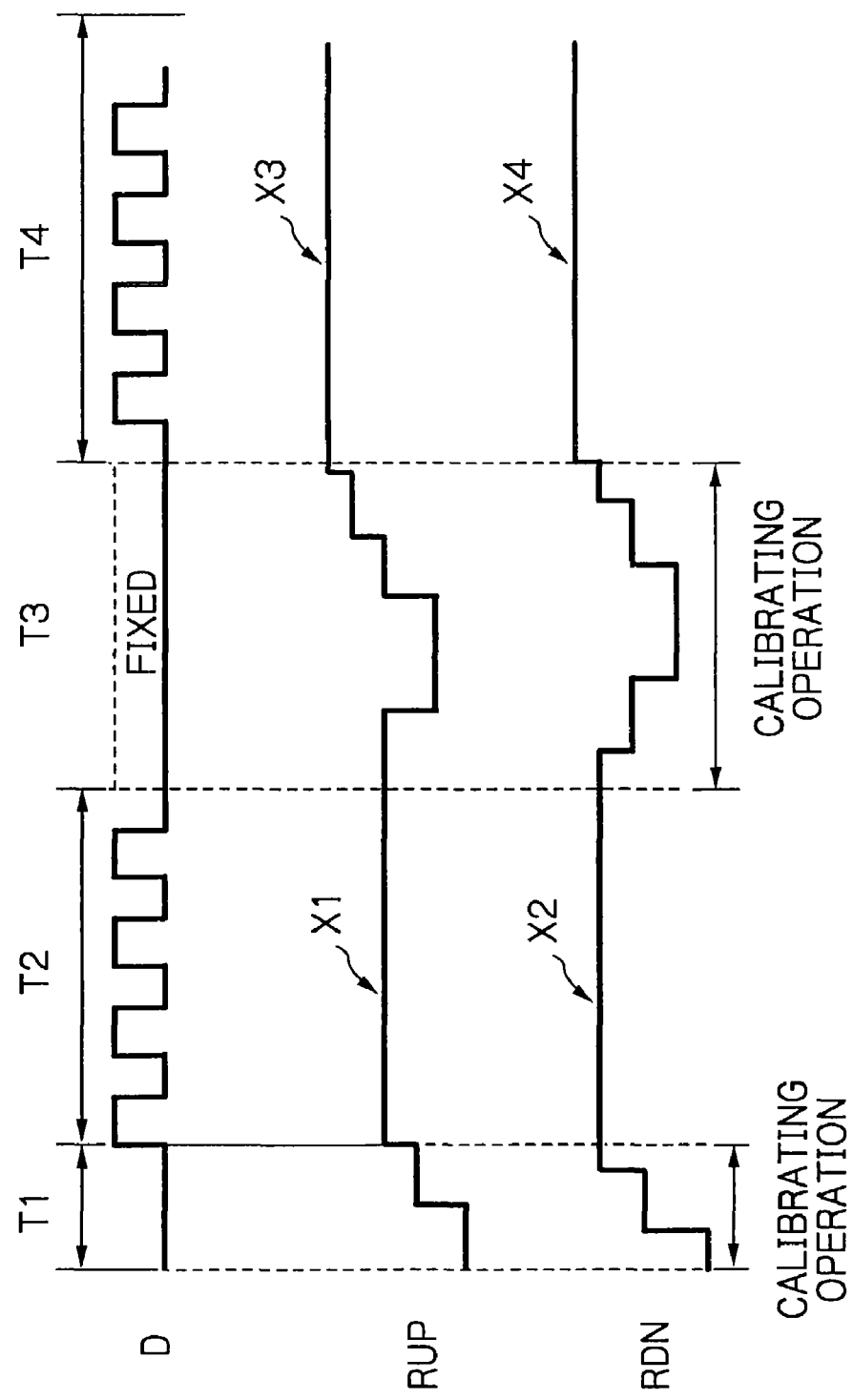
FIG. 8 is a timing diagram illustrating a modification of the calibrating operation of the impedance adjusting circuit of FIG. 1.

In order to suppress the distortion of the output signal at the output terminal OUT, as illustrated in FIG. 8, the calibrating operation of FIG. 6 can be carried out only during an initializing operation mode period T1 and a disabling operation mode period T3 where the data D is not supplied. In this case, however, during normal operation mode periods T2 and T4, the impedance codes RUP and RDN are not renewed, i.e., the impedance codes RUP and RDN immediately before the normal operation mode periods T2 and T4 are held as indicated by X1, X2, X3 and X4 of FIG. 8. Note that during the initializing operation mode period T1, the data signal D is "0" (low), while, during the disabling operation mode period T3, the data signal D is fixed at "0" (low) or "1" (high). As a result, a discrepancy between the output impedance of the output buffer apparatus and the characteristic impedance of the transmission line may be suppressed, which would suppress reflection noise at the terminal of the transmission line.

Figure 9:
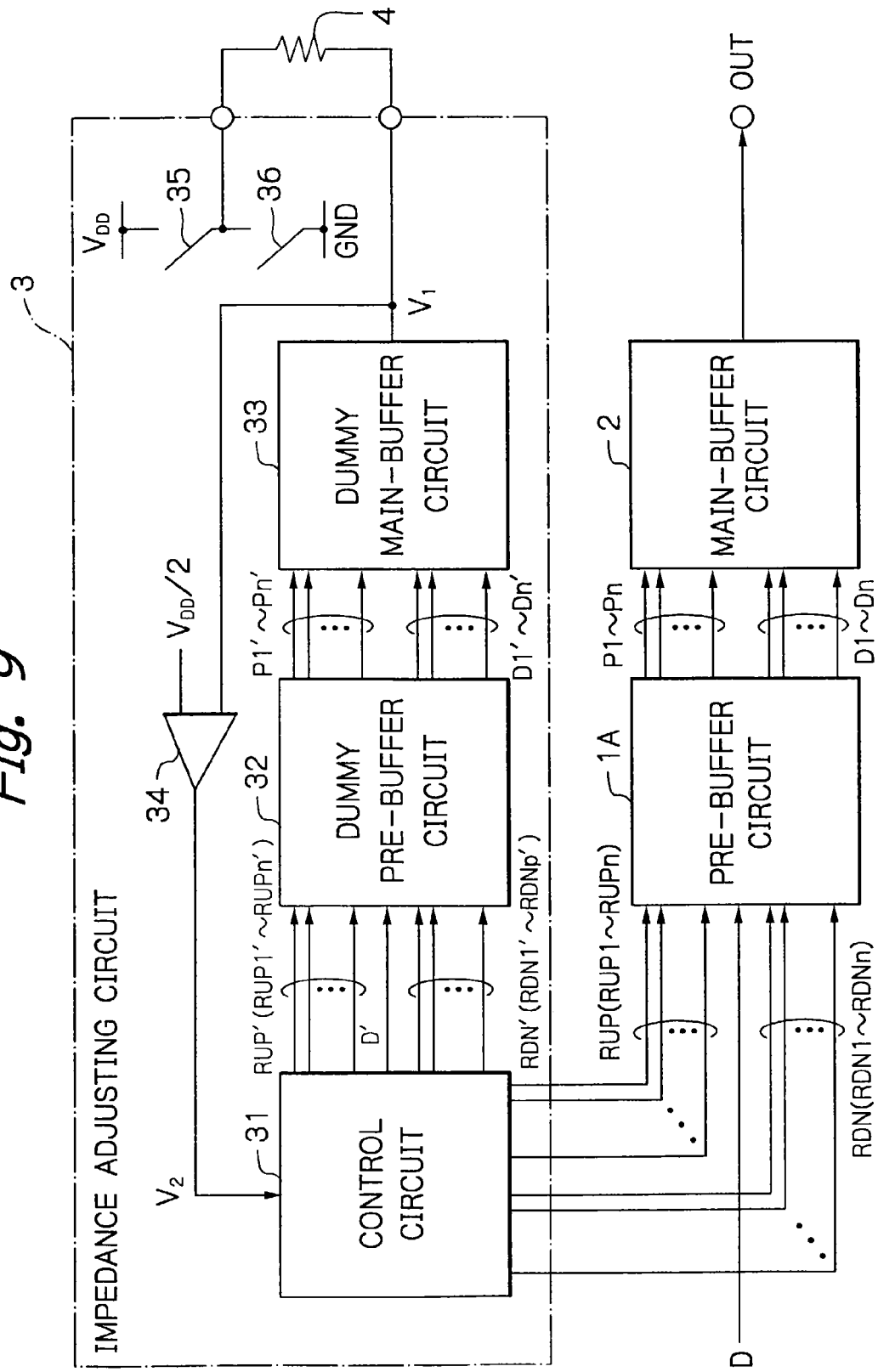
FIG. 9 is a block circuit diagram illustrating a first embodiment of the output buffer apparatus according to the present invention.

In FIG. 9, which illustrates a first embodiment of the output buffer apparatus according to the present invention, the pre-buffer circuit 1 of FIG. 1 is replaced by a pre-buffer circuit 1A.

Figure 10:
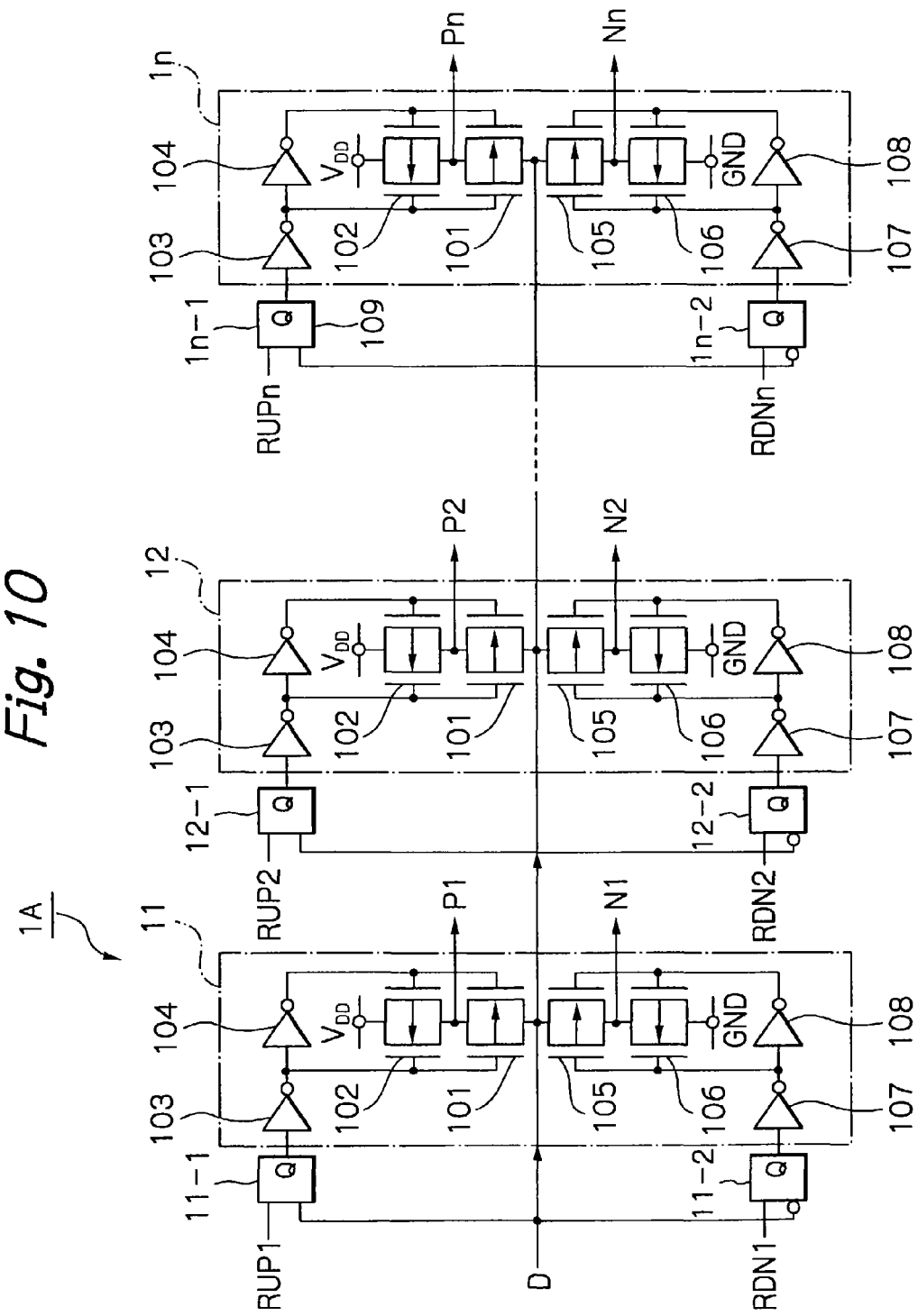
FIG. 10 is a detailed circuit diagram of the pre-buffer circuit of FIG. 9.

In FIG. 10, which is a detailed circuit diagram of the pre-buffer circuit 1A of FIG. 9, D-type flip-flops 11-1, 11-2, 12-1, 12-2, ..., 1n-1, 1n-2 are added to the elements of the pre-buffer circuit 1 of FIG. 2.

The D-type flip-flop 1i-1 (i=1, 2, ..., n) has a data input D for receiving the pull-up impedance adjusting signal RUPi, a clock terminal C for receiving the data signal D and an output terminal Q for generating an output signal which is transmitted to the inverter 103 of the pre-driver 1i. That is, the pull-up impedance adjusting signal RUPi is fetched by the D-type flip-flop 1i-1 in synchronization with a falling edge of the data signal D.

The D-type flip-flop 1i-2 (i=1, 2, ..., n) has a data input D for receiving the pull-down impedance adjusting signal RDNi, a clock terminal C for receiving an inverted signal of the data signal D and an output terminal Q for generating an output signal which is transmitted to the inverter 105 of the pre-driver 1i. That is, the pull-down impedance adjusting signal RDNi is fetched by the D-type flip-flop 1i-2 in synchronization with a rising edge of the data signal D.

The operation of the output buffer apparatus of FIG. 9 will be explained next with reference to FIG. 11, where the impedance codes RUP and RDN are always renewed by the flowchart of FIG. 6 and the graphs of FIGS. 7A and 7B, even during the initializing operation period T1 and the disabling operation period T3.

That is, the impedance code RUP is fetched at times t2, t4, t6, t8, t10, t12, t14, t16 by the falling edges of the data signal D. On the other hand, the impedance code RDN is fetched at times t1, t3, t5, t7, t9, t11, t13, t15 by the rising edges of the data signal D.

Figure 11:
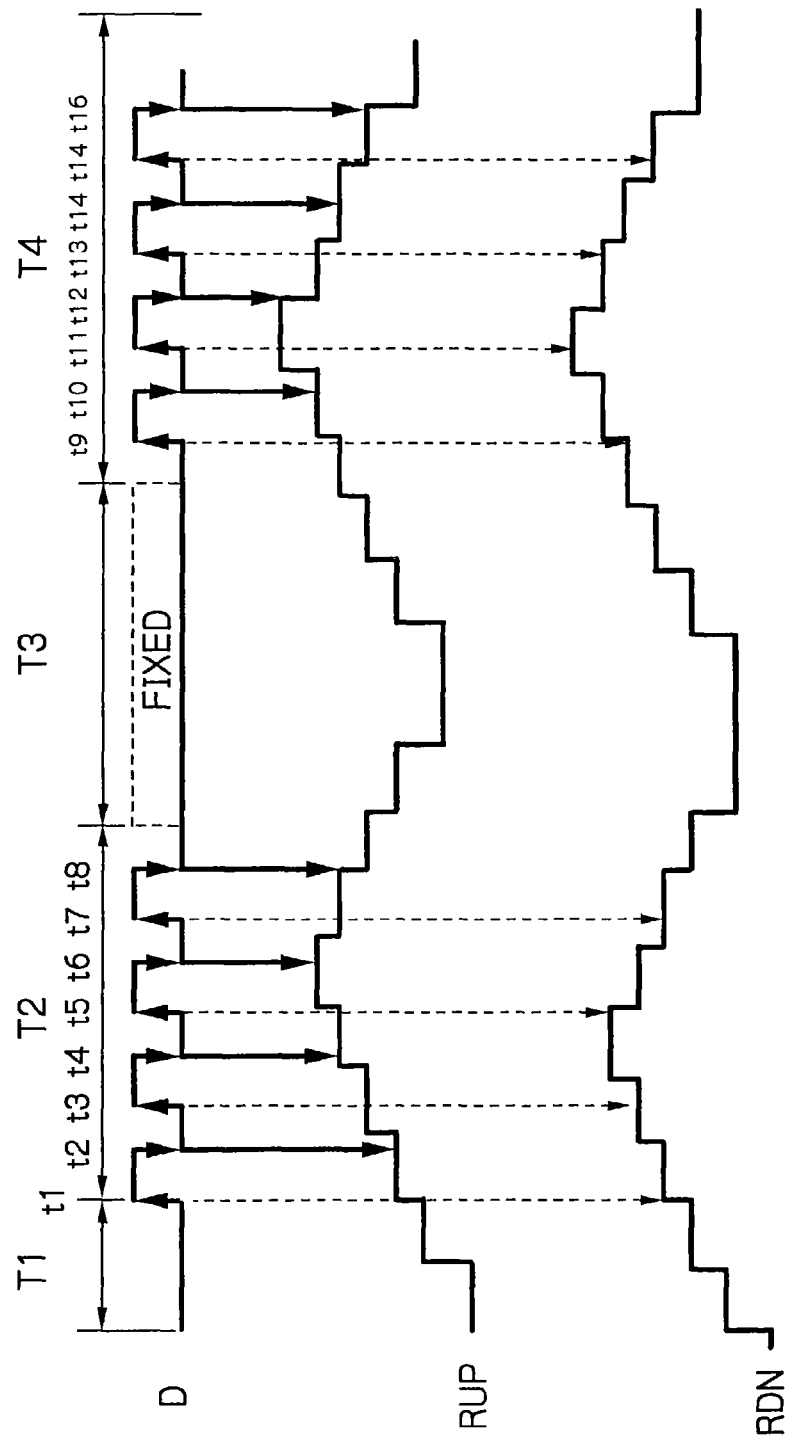
FIG. 11 is a timing diagram for explaining the operation of the output buffer apparatus of FIG. 9.

In the calibrating operation as illustrated in FIG. 11, since the calibrating operation is always carried out, the impedance codes RUP and RDN are renewed and fetched by the pre-buffer circuit 1 in synchronization with the data reading operation of the pre-buffer circuit 1 and the main-buffer circuit 2, so that the output signal at the output terminal OUT may be not changed in the middle of data "1" or "0", i.e., the output signal at the output terminal OUT is not distorted, thus improving the quality of the output signal at the output terminal OUT. Also, during the normal operation mode periods T2 and T4, since the impedance codes RUP and RDN are renewed, i.e., a discrepancy between the output impedance of the output buffer apparatus and the characteristic impedance of the transmission line may not be created, which would suppress reflection noise at the terminal of the transmission line.

Figure 12:
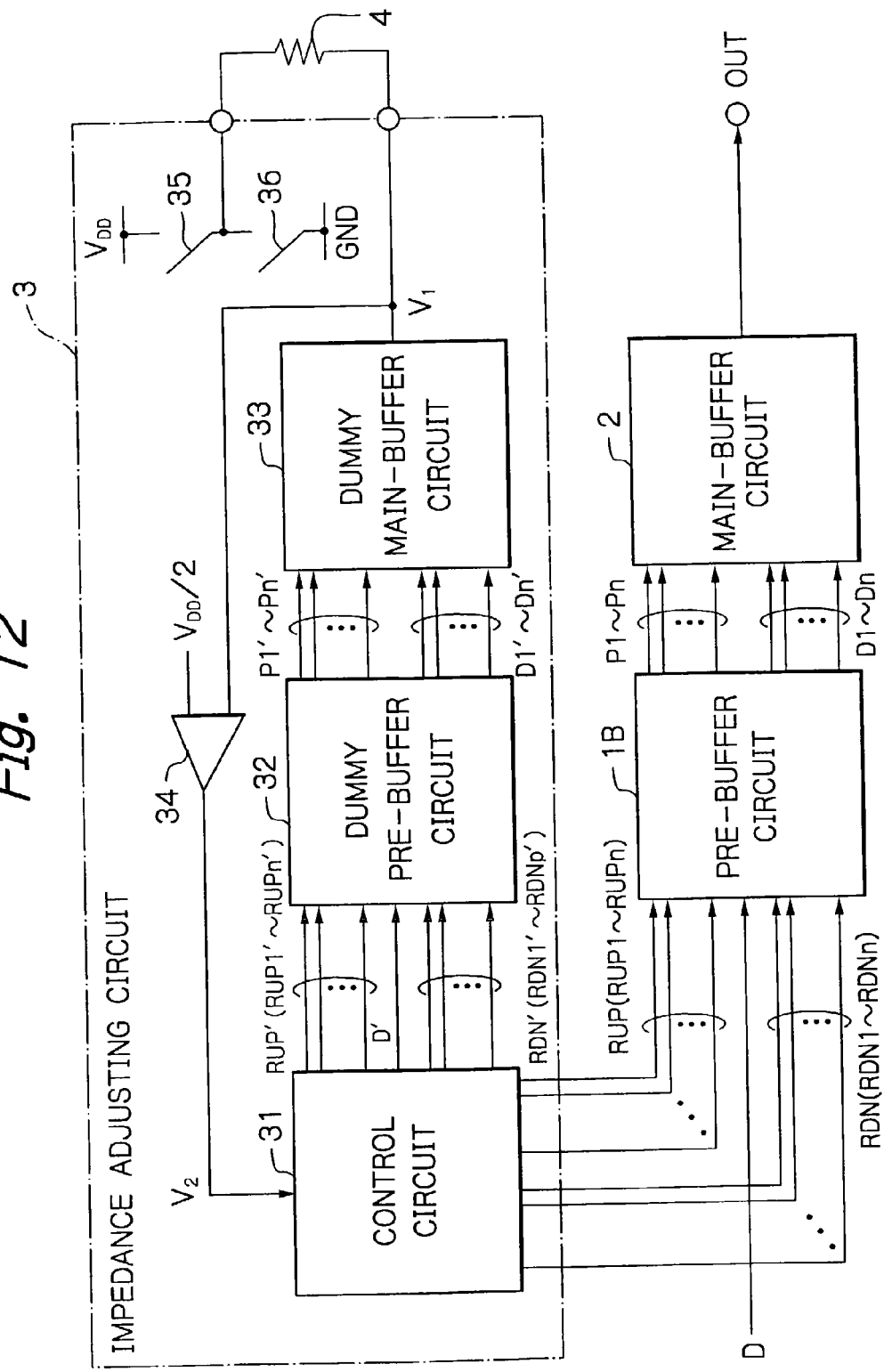
FIG. 12 is a block circuit diagram illustrating a second embodiment of the output buffer apparatus according to the present invention.

In FIG. 12, which illustrates a second embodiment of the output buffer apparatus according to the present invention, the pre-buffer circuit 1A of FIG. 9 is replaced by a pre-buffer circuit 1B.

Figure 13:
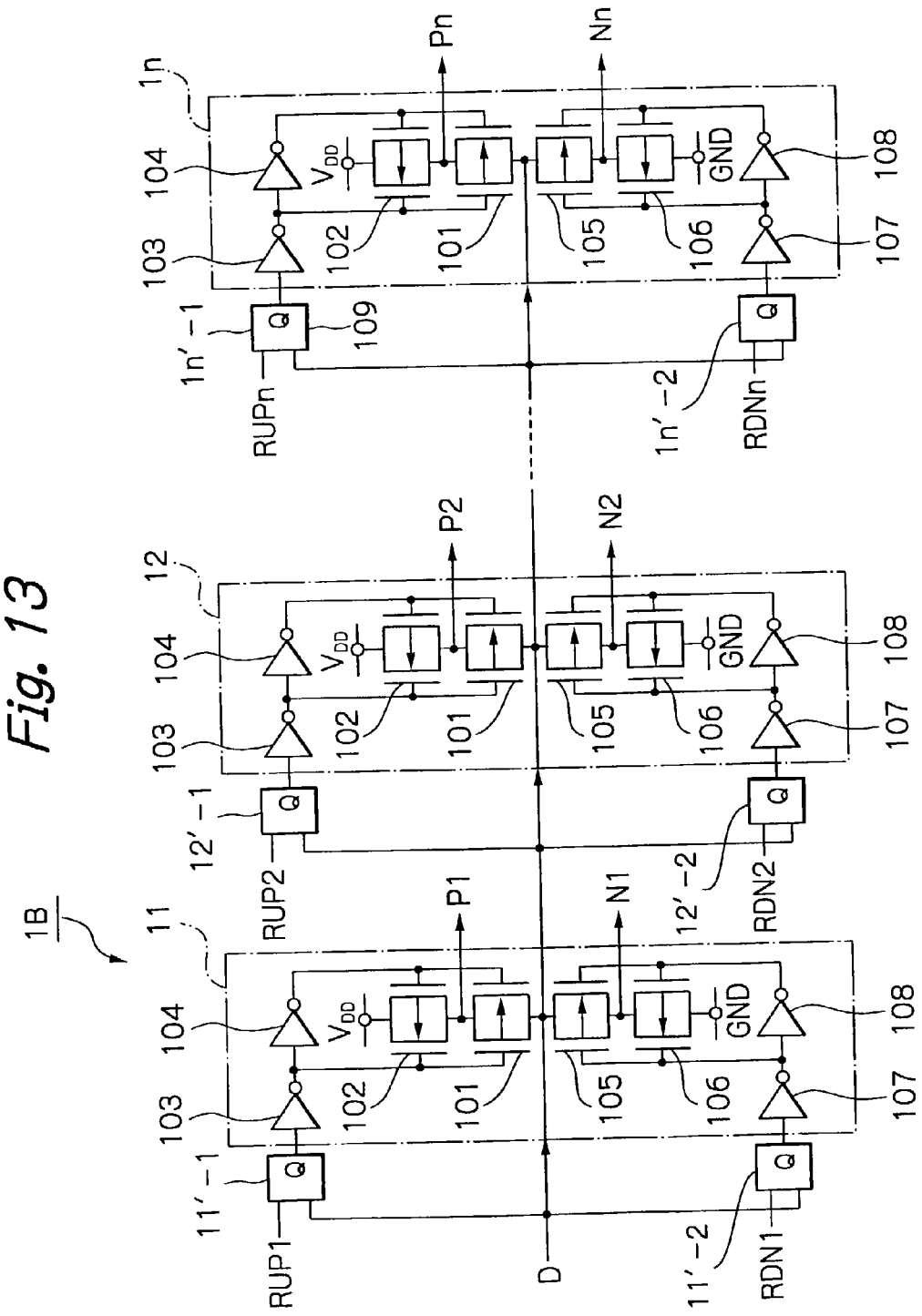
FIG. 13 is a detailed circuit diagram of the pre-buffer circuit of FIG. 12.

In FIG. 13, which is a detailed circuit diagram of the pre-buffer circuit 1B of FIG. 12, latch circuits 11'-1, 11'-2, 12'-1, 12'-2, . . . , 1n'-1, 1n'-2 are provided instead of the D-type flip-flops 11-1, 11-2, 12-1, 12-2, . . . , 1n-1, 1n-2, respectively, of FIG. 10.

Figures 14A, 14B:
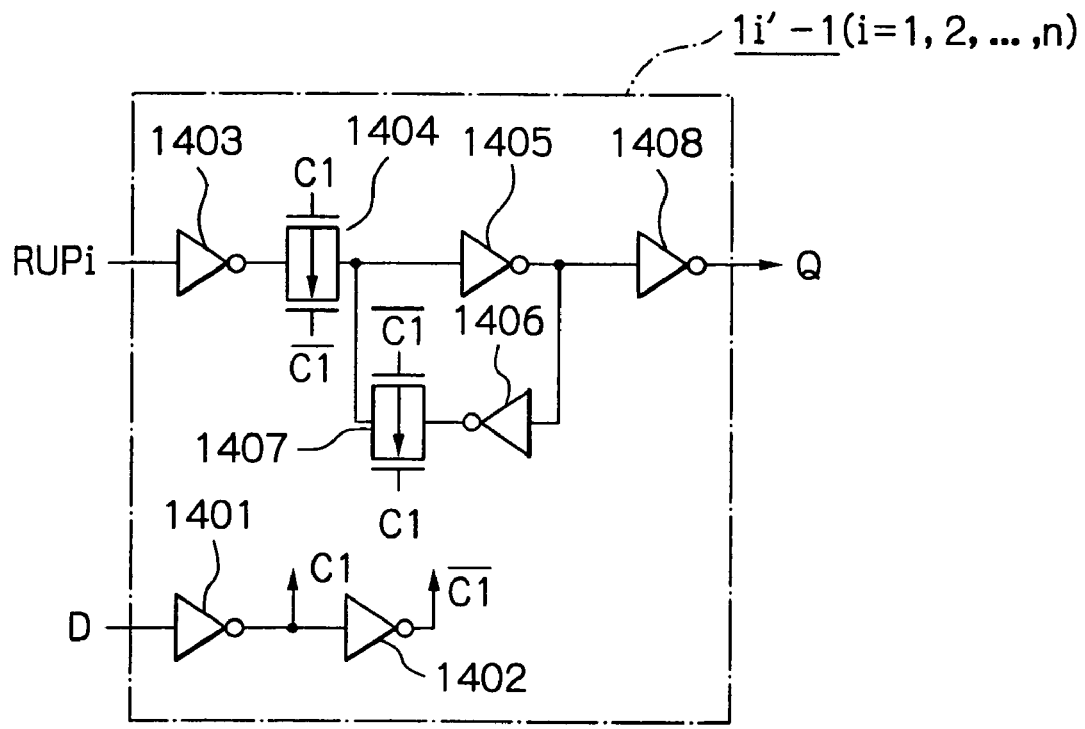
FIG. 14A is a detailed circuit diagram of the latch circuit 1$i$'-1 (i=1, 2, ... , n) of FIG. 13.
FIG. 14B is a table for explaining the operation of the latch circuit of FIG. 14A.

The latch circuit 1i'-1 (i=1, 2, . . . , n) is illustrated in detail in FIG. 14A. That is, the latch circuit 1i'-1 is constructed by inverters 1401 and 1402 for receiving the data signal D to generate clock signals C1 and its inverted signal, an inverter 1403 for receiving the pull-up impedance adjusting signal RUPi, a transfer gate 1404, inverters 1405 and 1406, a transfer gate 1407, and a buffer 1408 for generating a signal at an output terminal Q.

The operation of the latch circuit 1i'-1 (i=1, 2, . . . , n) is explained next with reference to FIG. 14B. That is, when the data signal D is "0" (low), the transfer gates 1404 and 1407 are turned OFF and ON, respectively, so that the latch circuit 1i'-1 is in a hold state. Therefore, the signal at the output terminal Q is the same as the pull-up impedance adjusting signal RUPi immediately before the data signal D is switched from "1" (high) to "0" (low). On the other hand, when the data signal D is "1" (high), the transfer gates 1404 and 1407 are turned ON and OFF, respectively, so that the latch circuit 1i'-1 is in a through state. Therefore, the signal at the output terminal Q is always the same as the pull-up impedance adjusting signal RUPi.

Figures 15A, 15B:
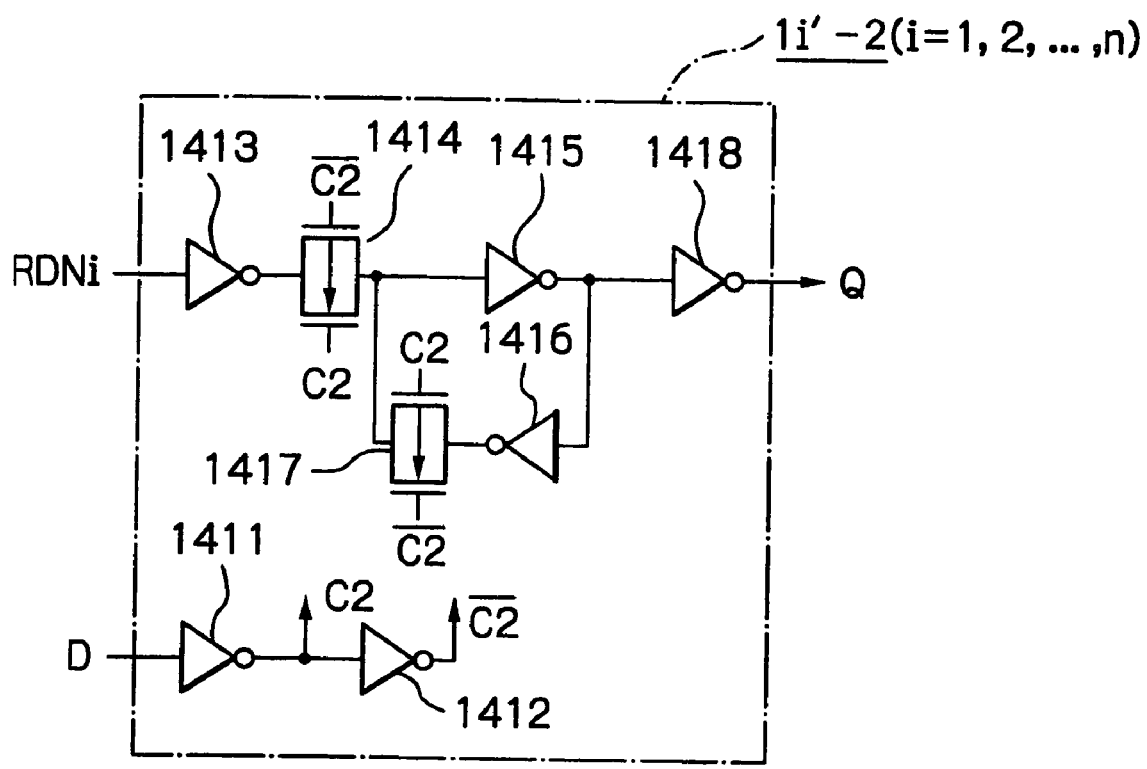
FIG. 15A is a detailed circuit diagram of the latch circuit 1$i$'-2 (i=1, 2, ... , n) of FIG. 13.
FIG. 15B is a table for explaining the operation of the latch circuit of FIG. 15A.

The latch circuit 1i'-2 (i=1, 2, . . . , n) is illustrated in detail in FIG. 15A. That is, the latch circuit 1i'-2 is constructed by inverters 1411 and 1412 for receiving the data signal D to generate clock signals C2 and its inverted signal, an inverter 1413 for receiving the pull-down impedance adjusting signal RDNi, a transfer gate 1414, inverters 1415 and 1416, a transfer gate 1417, and a buffer 1418 for generating a signal at an output terminal Q.

The operation of the latch circuit 1i'-2(i=1, 2, . . . , n) is explained next with reference to FIG. 15B. That is, when the data signal D is "0" (low), the transfer gates 1414 and 1417 are turned ON and OFF, respectively, so that the latch circuit 1i'-2 is in a through state. Therefore, the signal at the output terminal Q is always the same as the pull-down impedance adjusting signal RDNi. On the other hand, when the data signal D is "1" (high), the transfer gates 1414 and 1417 are turned OFF and ON, respectively, so that the latch circuit 1i'-2 is in a hold state. Therefore, the signal at the output terminal Q is the same as the pull-down impedance adjusting signal RDNi immediately before the data signal D is switched from "0" (low) to "1" (high).

The operation of the output buffer apparatus of FIG. 13 will be explained next with reference to FIG. 16, where the impedance codes RUP and RDN are always renewed by the flowchart of FIG. 6 and the graphs of FIGS. 7A and 7B, even during the initializing operation period T1 and the disabling operation period T3. Also, assume that the data signal D is fixed at "0" (low) during the disabling operation mode T3.

That is, the impedance code RUP is fetched at periods t2 to t3, t4 to t5, t6 to t7, t8 to t8', t10 to t11, t12 to t13, t14 to t15, t16 to t17 when the data signal D is "0" (low). On the other hand, the impedance code RDN is fetched at periods t1 to t2, t3 to t4, t5 to t6, t7 to t8, t9 to t10, t11 to t12, t13 to t14, t15 to t16 when the data signal D is "1" (high).

Figure 16:
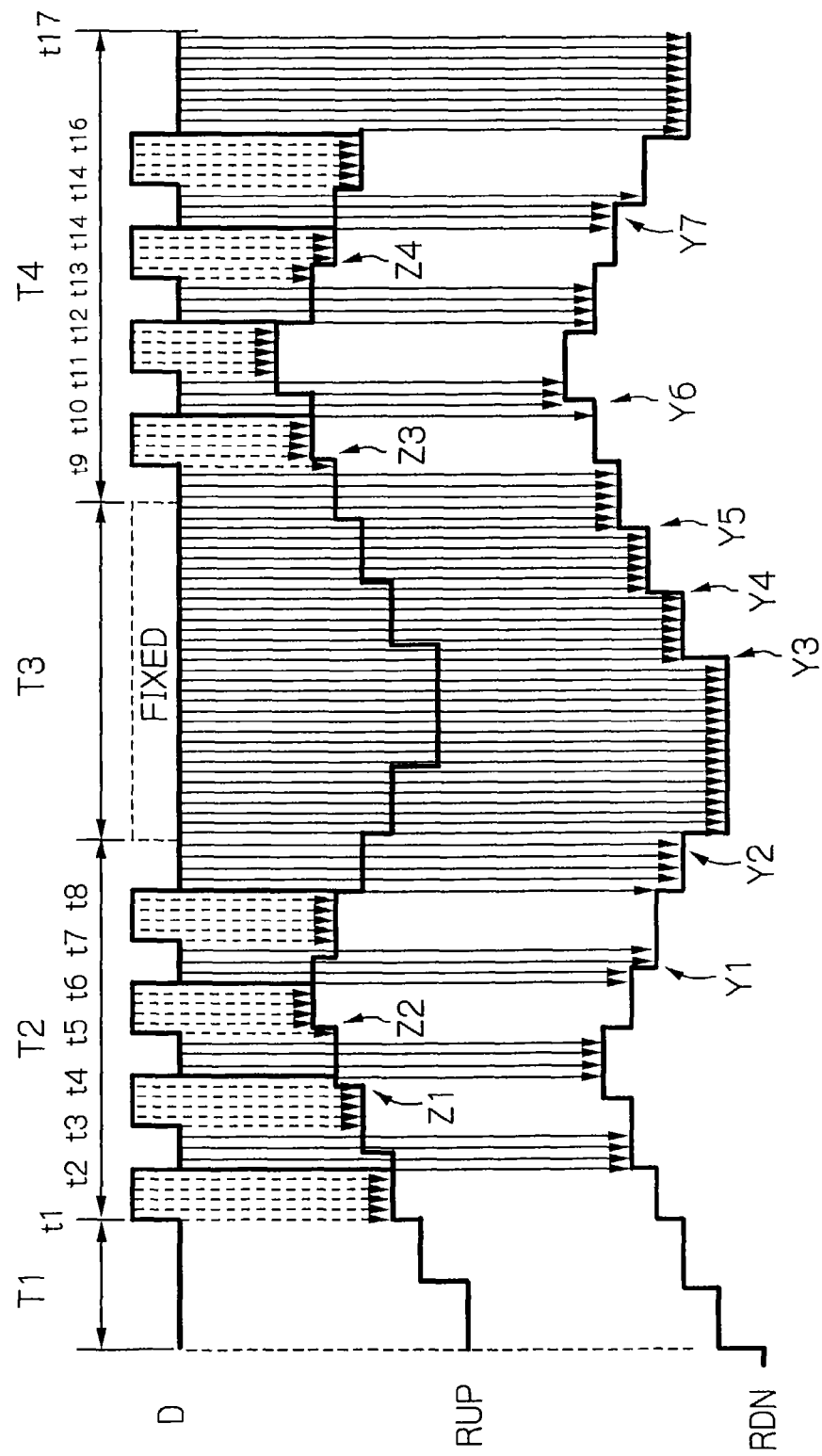
FIG. 16 is a timing diagram for explaining the operation of the output buffer apparatus of FIG. 12.

In the calibrating operation as illustrated in FIG. 16, when the impedance code RUP is changed as indicated by Y1, Y2, . . . in FIG. 16 while the data signal D continues at the value "0" (low), the changed code RUP is fetched, and also, when the impedance code RDN is changed as indicated by Z1, Z2, . . . in FIG. 16 while the data signal D continues at the value "1" (high), the changed code RDN is fetched. Therefore, a discrepancy between the output impedance of the output buffer apparatus and the characteristic impedance of the transmission line may be suppressed which would suppress reflection noise at the terminal of the transmission line.

As explained hereinabove, according to the present invention, the quality of the output signal can be improved, and also, reflection noise at a terminal of a transmission line connected to the output buffer apparatus can be suppressed.

What is claimed is:

1. An output buffer apparatus comprising:
   first and second power supply terminals;
   an output terminal;
   a main-buffer circuit including a plurality of first transistors which are connected between said first power supply terminal and said output terminal and a plurality of second transistors which are connected between said second power supply terminal and said output terminal;
   a pre-buffer circuit including a plurality of first pre-drivers one of said first pre-drivers driving one of said first transistors in accordance with a data and a plurality of second pre-drivers one of said second pre-drivers driving one of said second transistors in accordance with said data signal;
   a plurality of first sequential circuits which receive a first impedance adjusting signal in synchronization with said data signal to turn ON one of said first pre-drivers; and
   a plurality of second sequential circuits which receive a second impedance adjusting signal in synchronization with said data signal to turn ON one of said second pre-drivers.

2. The output buffer apparatus as set forth in claim 1, wherein said first sequential circuits comprise a first D-type flip-flop for fetching said first impedance adjusting signal in synchronization with a falling edge of said data signal, and
   wherein said second sequential circuits comprise a second D-type flip-flop for fetching said second impedance adjusting signal in synchronization with a rising edge of said data signal.

3. The output buffer apparatus as set forth in claim 1, wherein said first sequential circuits comprise a first latch circuit which is in a hold state when said data signal indicates a first value and is in a through state when said data signal indicates a second value, and
   wherein said second sequential circuits comprise a second latch circuit which is in a through state when said data signal indicates said first value and is in a hold state when said data signal indicates said second value.

4. The output buffer apparatus as set forth in claim 3, wherein said first latch circuits comprise:
   a first transfer gate for receiving said first impedance adjusting signal, said first transfer gate being turned OFF and ON when said data signal indicates said first and second values, respectively;
   first and second inverters connected in a first feedback loop connected to said first transfer gate; and
   a second transfer gate inserted into said first feedback ioop, said second transfer gate being turned ON and OFF when said data signal indicates said first and second values, respectively, wherein said second latch circuits comprise:
   a third transfer gate for receiving said second impedance adjusting signal, said third transfer gate being turned ON and OFF when said data signal indicates said first and second values, respectively;
   third and fourth inverters connected in a second feedback loop connected to said third transfer gate; and
   a fourth transfer gate inserted into said second feedback loop, said fourth transfer gate being turned OFF and ON when said data signal indicates said first and second values, respectively.

5. An output buffer apparatus comprising:
   a power supply terminal;
   a ground terminal;
   an output terminal;
   a main-buffer circuit including a plurality of P-channel MOS transistors which are connected between said power supply terminal and said output terminal and a plurality of N-channel MOS transistors which are connected between said ground terminal and said output terminal;
   a pre-buffer circuit including a plurality of first pre-drivers which drive one of said P-channel MOS transistors in accordance with a data signal and a plurality of second pre-drivers which drive one of said N-channel MOS transistors in accordance with said data signal;
   a plurality of first D-type flip-flops which receive a first impedance adjusting signal in synchronization with a falling edge of said data signal to turn ON one of said first pre-drivers; and
   a plurality of second D-type flip-flops which receive a second impedance adjusting signal in synchronization with a rising edge of said data signal to turn ON one of said second pre-drivers.

6. An output buffer apparatus comprising:
   a power supply terminal;
   a ground terminal;
   an output terminal;
   a main-buffer circuit including a plurality of P-channel MOS transistors which are connected between said power supply terminal and said output terminal and a plurality of N-channel MOS transistors which are connected between said ground terminal and said output terminal;
   a pre-buffer circuit including a plurality of first pre-drivers which drive one of said P-channel MOS transistors in accordance with a data signal and a plurality of second pre-drivers which drive one of said N-channel MOS transistors in accordance with said data signal;
   a plurality of first latch circuits which receive a first impedance adjusting signal to turn ON one of said first pre-drivers, said first latch circuits being in a hold state when said data signal indicates a first value and being in a through state when said data signal indicates a second value;
   a plurality of second latch circuits which receive a second impedance adjusting signal to turn ON one of said second pre-drivers, said second latch circuits being in a through state when said data signal indicates said first value and being in a hold state when said data signal indicates said second value.

7. The output buffer apparatus as set forth in claim 6, wherein said first latch circuits comprise:
   a first transfer gate for receiving said first impedance adjusting signal, said first transfer gate being turned OFF and ON when said data signal indicates said first and second values, respectively;
   first and second inverters connected in a first feedback loop connected to said first transfer gate; and
   a second transfer gate inserted into said first feedback loop, said second transfer gate being turned ON and OFF when said data signal indicates said first and second values, respectively,
   wherein said second latch circuits comprise:
      a third transfer gate for receiving said second impedance adjusting signal, said third transfer gate being turned ON and OFF when said data signal indicates said first and second values, respectively;
      third and fourth inverters connected in a second feedback loop connected to said third transfer gate; and
      a fourth transfer gate inserted into said second feedback loop, said fourth transfer gate being turned OFF and ON when said data signal indicates said first and second values, respectively.

8. The output buffer apparatus as set forth in claim 1, wherein said first sequential circuits comprise a first latch circuit which is in a hold state when said data signal indicates a first value and is in a through state when said data signal indicates a second value.

9. The output buffer apparatus as set forth in claim 8, wherein said first latch circuits comprise:
   a first transfer gate for receiving said first impedance adjusting signal, said first transfer gate being turned OFF and ON when said data signal indicates said first and second values, respectively.

10. The output buffer apparatus as set forth in claim 9, wherein said first latch circuits further comprise:
    first and second inverters connected in a first feedback ioop connected to said first transfer gate.

11. The output buffer apparatus as set forth in claim 10, wherein said first latch circuits further comprise:
    a second transfer gate inserted into said first feedback loop, said second transfer gate being turned ON and OFF when said data signal indicates said first and second values, respectively.

12. The output buffer apparatus as set forth in claim 1, wherein said second sequential circuits comprise a second latch circuit which is in a through state when said data signal indicates said first value and is in a hold state when said data signal indicates said second value.

13. The output buffer apparatus as set forth in claim 12, wherein said second latch circuits comprise:
    a third transfer gate for receiving said second impedance adjusting signal, said third transfer gate being turned ON and OFF when said data signal indicates said first and second values, respectively;
    third and fourth inverters connected in a second feedback loop connected to said third transfer gate; and
    a fourth transfer gate inserted into said second feedback loop, said fourth transfer gate being turned OFF and ON when said data signal indicates said first and second values, respectively.

14. The output buffer apparatus as set forth in claim 1, wherein a first sequential circuit in said plurality of first sequential circuits transmits an output signal to an inverter of one of said first pre-drivers.

15. The output buffer apparatus as set forth in claim 1, wherein a second sequential circuit in said plurality of second sequential circuits transmits an output signal to an inverter of one of said second pre-drivers.

* * * * *